(12) United States Patent
Guo et al.

(10) Patent No.: US 12,538,426 B2
(45) Date of Patent: Jan. 27, 2026

(54) CIRCUIT BOARD ASSEMBLY AND ELECTRONIC DEVICE

(71) Applicant: HONOR DEVICE CO., LTD., Guangdong (CN)

(72) Inventors: Jianqiang Guo, Shenzhen (CN); Liying Wang, Shenzhen (CN); Xiaoyan Wang, Shenzhen (CN); Fan Yang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 16 days.

(21) Appl. No.: 18/005,461

(22) PCT Filed: Aug. 18, 2022

(86) PCT No.: PCT/CN2022/113353
§ 371 (c)(1),
(2) Date: Jan. 13, 2023

(87) PCT Pub. No.: WO2023/045642
PCT Pub. Date: Mar. 30, 2023

(65) Prior Publication Data
US 2024/0276651 A1   Aug. 15, 2024

(30) Foreign Application Priority Data
Sep. 23, 2021   (CN) .......................... 202111117615.9

(51) Int. Cl.
*H05K 1/14*   (2006.01)
(52) U.S. Cl.
CPC ............. *H05K 1/144* (2013.01); *H05K 1/145* (2013.01); *H05K 2201/10378* (2013.01)

(58) Field of Classification Search
CPC ......... H05K 2201/10378; H05K 1/144; H05K 1/145
See application file for complete search history.

(56) References Cited

U.S. PATENT DOCUMENTS 5,570,274 A    10/1996  Saito et al.
7,258,549 B2 *  8/2007  Asahi ................. H01R 13/2414
                                                        439/91

(Continued)

FOREIGN PATENT DOCUMENTS

CN    106604539 A    4/2017
CN    104604342 B    2/2018

(Continued)

*Primary Examiner* — James Wu
(74) *Attorney, Agent, or Firm* — Fish & Richardson P.C.

(57) ABSTRACT

A circuit board assembly is provided. The circuit board assembly includes at least a frame plate and circuit boards. The frame plate includes a frame body, first soldering portions, and second soldering portions. The frame body has a middle accommodating hole, an inner wall facing the middle accommodating hole, and an outer wall facing away from the middle accommodating hole. The first soldering portions are provided in an intermediate region located on the frame body between the inner wall and the outer wall. At least one of the inner wall and the outer wall is provided with accommodating grooves. The accommodating grooves extend along a thickness direction of the frame plate. The second soldering portions are provided in the accommodating grooves and connected to the frame body. Two circuit boards are respectively provided on two opposite sides of the frame plate along the thickness direction. The circuit board includes pads.

20 Claims, 11 Drawing Sheets

(56) References Cited

U.S. PATENT DOCUMENTS

| | | | |
|---|---|---|---|
| 11,439,012 B2 | 9/2022 | Park et al. | |
| 2005/0124186 A1* | 6/2005 | Young | H01L 25/105 439/71 |
| 2007/0279890 A1 | 12/2007 | Motohara et al. | |
| 2008/0278920 A1* | 11/2008 | Mizuhara | H05K 1/141 257/E23.068 |
| 2011/0317386 A1* | 12/2011 | Kawabata | H05K 3/368 361/772 |
| 2020/0266562 A1 | 8/2020 | Park et al. | |
| 2021/0022247 A1 | 1/2021 | Ha et al. | |
| 2021/0144856 A1 | 5/2021 | Park et al. | |

FOREIGN PATENT DOCUMENTS

| | | | |
|---|---|---|---|
| CN | 111830747 A | 10/2020 | |
| CN | 212344142 U | 1/2021 | |
| CN | 212677451 U | 3/2021 | |
| CN | 215010855 U | 12/2021 | |
| JP | H06275774 A | 9/1994 | |
| JP | 2004241645 A | 8/2004 | |
| KR | 20210055995 A | 5/2021 | |
| WO | 0019532 A1 | 4/2000 | |

* cited by examiner

CIRCUIT BOARD ASSEMBLY AND ELECTRONIC DEVICE

CROSS-REFERENCE TO RELATED APPLICATIONS

This application is a national stage of International Application No. PCT/CN2022/113353, filed on Aug. 18, 2022, which claims priority to Chinese Patent Application No. 202111117615.9, filed on Sep. 23, 2021. The disclosures of the aforementioned applications are hereby incorporated by reference in their entireties.

TECHNICAL FIELD

Embodiments of this application relate to the field of terminal technologies, and in particular, to a circuit board assembly and an electronic device.

BACKGROUND

As electronic products develop towards the direction of high-density packaging, at present, a plurality of circuit boards are usually stacked to provide a larger arrangement space for a battery and other functional modules in the electronic devices. In the manner of stacking a plurality of circuit boards, electronic components may be scattered on the circuit boards. In this way, all the electronic components can be arranged without increasing areas of the circuit boards that bear the electronic components.

In the manner of stacking a plurality of circuit boards, two adjacent circuit boards are connected by using a frame plate. The frame plate and the circuit boards are assembled by soldering to form a circuit board assembly. Different circuit boards may be electrically connected to each other by using a frame plate to implement data information exchange. Because a circuit board and a frame plate are two mechanical parts designed separately, the circuit board and the frame plate are easily separated at a connection joint in a scenario with an uneven force such as a drop or a collision of an electronic device, causing a communication failure or malfunction of a circuit board assembly.

SUMMARY

Embodiments of this application provide a circuit board assembly and an electronic device, which can increase a connection force between a circuit board and a frame plate, and effectively reduce a possibility of separation between the circuit board and the frame plate.

A first aspect of this application provides a circuit board assembly. The circuit board assembly is used in an electronic device. The circuit board assembly includes at least a frame plate and circuit boards. The frame plate includes a frame body, first soldering portions, and second soldering portions. The frame body has a middle accommodating hole, an inner wall facing the middle accommodating hole, and an outer wall facing away from the middle accommodating hole. The first soldering portions are provided in an intermediate region located on the frame body between the inner wall and the outer wall. At least one of the inner wall and the outer wall is provided with accommodating grooves. The accommodating grooves extend along a thickness direction of the frame plate. The second soldering portions are provided in the accommodating grooves and connected to the frame body. Two circuit boards are respectively provided on two opposite sides of the frame plate along the thickness direction. The circuit board includes pads. The first soldering portions and the second soldering portions are soldered to corresponding pads, respectively.

The circuit board assembly in this embodiment of this application includes the frame plate and the circuit boards. The frame plate includes the frame body, the first soldering portions located in the intermediate region, and the second soldering portions located on at least one of the outer wall and the inner wall. When a width of the frame body can be kept unchanged, density of connection points formed by the first soldering portions and the second soldering portions provided on the frame body is higher. The circuit board is connected to the frame plate by using the first soldering portions and the second soldering portions, so that edge regions of the circuit hoard and the frame plate are in a connected state. In addition, a connection force between the circuit hoard and the frame plate is increased due to an increase of the connection points between the circuit board and the frame plate. When the circuit board assembly encounters an uneven force upon a drop, a collision, or the like, the first soldering portions and the second soldering portions between the circuit board and the frame plate can buffer the force, thereby effectively reducing a possibility of separation between the circuit board and the frame plate.

In a possible implementation, the accommodating groove includes a bottom surface and side surfaces. The bottom surface intersects the side surfaces. A shape of a surface of the second soldering portion that faces the bottom surface matches a shape of the bottom surface. A shape of a surface of the second soldering portion that faces the side surface matches a shape of the side surface. The surface of the second soldering portion that faces the accommodating groove can fit tightly with the surface of the accommodating groove. This helps increase a bonding force between the surface of the second soldering portion and the surface of the accommodating groove, and reduce a possibility that the circuit board fails to be connected to the frame plate by using the second soldering portion due to separation between the surface of the second soldering portion and the surface of accommodating groove.

In a possible implementation, an included angle between the bottom surface and the side surface of the accommodating groove may range from 90° to 110°.

In a possible implementation, the accommodating groove runs through two surfaces of the frame body that are opposite to each other along the thickness direction.

In a possible implementation, the first soldering portions and the second soldering portions are respectively soldered to the corresponding pads on the circuit board by using solder joints.

in a possible implementation, surfaces of the second soldering portion that face away from the middle accommodating hole include a first concave surface, a second concave surface, and a third concave surface. The first concave surface, the second concave surface, and the third concave surface are depressed towards the intermediate region. The second concave surface and the third concave surface are respectively located on both sides of the first concave surface along a circumferential direction of the frame plate. An intersecting region between the first concave surface and the second concave surface and an intersecting region between the first concave surface and the third concave surface both exceed an opening of the accommodating groove.

In a possible implementation, a depression depth of the second concave surface and a depression depth of the third concave surface each are less than a depression depth of the first concave surface.

In a possible implementation, the first concave surface, the second concave surface, and the third concave surface are all arc surfaces.

In a possible implementation, a central angle corresponding to the first concave surface is 60° to 120°.

In a possible implementation, the first concave surface, the second concave surface, and the third concave surface have a same radius. When the first concave surface, the second concave surface, and the third concave surface are processed and manufactured by drilling or milling, it is convenient to use a tool with one diameter for cutting. This reduces a possibility that a processing operation is complex and processing efficiency is low due to a need of replacing tools with different diameters.

In a possible implementation, along the circumferential direction of the frame plate, two or more accommodating grooves are evenly distributed, and two or more second soldering portions are evenly distributed. A spacing between every two adjacent accommodating grooves is equal. A quantity and locations of the second soldering portions one-to-one correspond to a quantity and locations of the accommodating grooves. Two or more second soldering portions are also evenly distributed along the circumferential direction of the frame plate. Therefore, soldering all the second soldering portions to the corresponding pads on the circuit board is advantageous to improving a force balance of the circuit board at each location, and reducing a possibility of local warpage of the circuit board due to an unbalanced connection force between the circuit board and the frame plate at different locations.

In a possible implementation, the inner wall and the outer wall each are provided with the accommodating grooves, so that the second soldering portion is provided in each accommodating groove. This further helps increase the density of the connection points formed by the first soldering portions and the second soldering portions provided on the frame plate.

In a possible implementation, a quantity and locations of the accommodating grooves on the outer wall one-to-one correspond to a quantity and locations of the accommodating grooves on the inner wall.

In a possible implementation, two or more rows of through holes are provided in the intermediate region. Each of the through holes is correspondingly provided with the first soldering portion. The two or more rows of through holes are spaced along a width direction of the frame plate. In one row of the through holes close to the outer wall, one of the accommodating grooves on the outer wall is provided corresponding to two of the through holes. In one row of the through holes close to the inner wall, one of the accommodating grooves on the inner wall is provided corresponding to two of the through holes.

A second aspect of the embodiments of this application provides an electronic device. The electronic device includes the circuit board assembly described above.

The circuit board assembly includes at least a frame plate and circuit boards. The frame plate includes a frame body, first soldering portions, and second soldering portions. The frame body has a middle accommodating hole, an inner wall facing the middle accommodating hole, and an outer wall facing away from the middle accommodating hole. The first soldering portions are provided in an intermediate region located on the frame body between the inner wall and the outer wall. At least one of the inner wall and the outer wall is provided with accommodating grooves. The accommodating grooves extend along a thickness direction of the frame plate. The second soldering portions are provided in the accommodating grooves and connected to the frame body. Two circuit boards are respectively provided on two opposite sides of the frame plate along the thickness direction. The circuit board includes pads. The first soldering portions and the second soldering portions are soldered to corresponding pads, respectively.

In a possible implementation, the accommodating groove includes a bottom surface and side surfaces. The bottom surface intersects the side surfaces. A shape of a surface of the second soldering portion that faces the bottom surface matches a shape of the bottom surface. A shape of a surface of the second soldering portion that faces the side surface matches a shape of the side surface. The surface of the second soldering portion that faces the accommodating groove can fit tightly with the surface of the accommodating groove. This helps increase a bonding force between the surface of the second soldering portion and the surface of the accommodating groove, and reduce a possibility that the circuit board fails to be connected to the frame plate by using the second soldering portion due to separation between the surface of the second soldering portion and the surface of accommodating groove.

In a possible implementation, an included angle between the bottom surface and the side surface of the accommodating groove may range from 90° to 110°.

In a possible implementation, the accommodating groove runs through two surfaces of the frame body that are opposite to each other along the thickness direction.

In a possible implementation, the first soldering portions and the second soldering portions are respectively soldered to the corresponding pads on the circuit board by using solder joints.

In a possible implementation, surfaces of the second soldering portion that face away from the middle accommodating hole include a first concave surface, a second concave surface, and a third concave surface. The first concave surface, the second concave surface, and the third concave surface are depressed towards the intermediate region. The second concave surface and the third concave surface are respectively located on both sides of the first concave surface along a circumferential direction of the frame plate. An intersecting region between the first concave surface and the second concave surface and an intersecting region between the first concave surface and the third concave surface both exceed an opening of the accommodating groove.

In a possible implementation, a depression depth of the second concave surface and a depression depth of the third concave surface each are less than a depression depth of the first concave surface.

In a possible implementation, the first concave surface, the second concave surface, and the third concave surface are all arc surfaces.

In a possible implementation, a central angle corresponding to the first concave surface is 60° to 120°.

In a possible implementation, the first concave surface, the second concave surface, and the third concave surface have a same radius. When the first concave surface, the second concave surface, and the third concave surface are processed and manufactured by drilling or milling, it is convenient to use a tool with one diameter for cutting. This reduces a possibility that a processing operation is complex and processing efficiency is low due to a need of replacing tools with different diameters.

In a possible implementation, along; the circumferential direction of the frame plate, two or more accommodating grooves are evenly distributed, and two or more second soldering portions are evenly distributed. A spacing between every two adjacent accommodating grooves is equal. A quantity and locations of the second soldering; portions one-to-one correspond to a quantity and locations of the accommodating grooves. Two or more second soldering portions are also evenly distributed along the circumferential direction of the frame plate. Therefore, soldering all the second soldering portions to the corresponding pads on the circuit board is advantageous to improving a force balance of the circuit board at each location, and reducing a possibility of local warpage of the circuit board due to an unbalanced connection force between the circuit board and the frame plate at different locations.

In a possible implementation, the inner wall and the outer wall each are provided with the accommodating grooves, so that the second soldering portion is provided in each accommodating groove. This further helps increase the density of the connection points formed by the first soldering portions and the second soldering portions provided on the frame plate.

In a possible implementation, a quantity and locations of the accommodating grooves on the outer wall one-to-one correspond to a quantity and locations of the accommodating grooves on the inner wall.

In a possible implementation, two or more rows of through holes are provided in the intermediate region. Each of the through holes is correspondingly provided with the first soldering portion. The two or more rows of through holes are spaced along a width direction of the frame plate. In one row of the through holes close to the outer wall, one of the accommodating grooves on the outer wall is provided corresponding to two of the through holes. In one row of the through holes close to the inner wall, one of the accommodating grooves on the inner wall is provided corresponding to two of the through holes.

A third aspect of the embodiments of this application provides a manufacturing method for a frame plate. The manufacturing method includes the following steps:

A copper clad substrate is provided, where the copper clad substrate includes a dielectric layer and copper clad layers on both sides.

A hole is drilled in the copper clad substrate to form a first via.

A first copper layer is formed on an inner wall of the first via, and the first copper layer is electrically connected to the copper clad layers on both sides.

A central hole of the first copper layer is filled with a resin block.

A hole is drilled in the copper clad substrate to form a second via, where the first via and the second via are spaced apart.

An anti-electroplating film is provided on a surface of the copper clad layer.

A second copper layer is formed on an inner wall of the second via and on the surface of the copper clad layer by successively using a chemical plating process and an electroplating process.

The anti-electroplating film is removed.

The copper clad layer and the second copper layer on the surface of the copper clad layer are patterned by using an etching process.

A solder-resist material layer is provided in an etched region.

The copper-clad substrate is cut into a frame plate with a predetermined shape by using a finish machining-based contour processing process. After the processing is completed, portions of the second via and the second copper layer are cut off. The first via forms a through hole, and the copper clad layer, the first copper layer, and the second copper layer that correspond to the first via form a first soldering portion. A remaining portion of the second via forms an accommodating groove, and the copper clad layer and the second copper layer that correspond to the remaining portion of the second via form a second soldering portion.

DESCRIPTION OF REFERENCE NUMERALS

10: electronic device;
20: display assembly;

30: middle frame;
40: circuit board assembly;
41: circuit board; and 411: pad;
42: frame plate;
421: frame body; 421a: middle accommodating hole; 4211: outer wall; 4211a: accommodating groove; 4211aa: bottom surface; 4211ab: side surface; 4211b: through hole; 4212: inner wall; and 4213: intermediate region;
422: first soldering portion;
423: second soldering portion; 423a: first concave surface; 423b: second concave surface; and 423c: third concave surface;
43: electronic component;
50: rear cover;
60: solder joint;
100: copper clad substrate; 101: copper clad layer; and 102: dielectric layer;
200: first via;
300: first copper layer;
400: resin block;
500: second via;
600: anti-electroplating film;
700: second copper layer;
800: solder-resist material layer; and
X: thickness direction.

DESCRIPTION OF EMBODIMENTS

Figure 1:
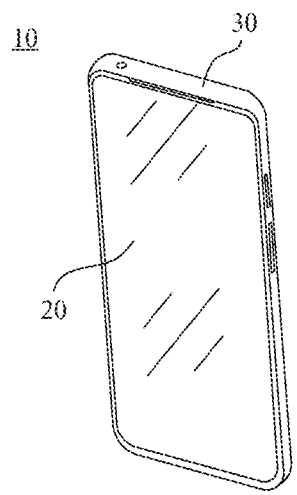
FIG. 1 is a schematic diagram of a structure of an electronic device according to an embodiment of this application.

FIG. 1 schematically shows a structure of an electronic device 10 according to an embodiment. As shown in FIG. 1, an embodiment of this application provides the electronic device 10. The electronic device 10 may be a mobile terminal, a fixed terminal, or a foldable device, such as a monitor, a handheld wireless communication device, a desktop computer, a laptop (laptop) computer, a tablet (Tablet) computer, an ultra-mobile personal computer (ultra-mobile personal computer, UMPC), a handheld computer, a walkie-talkie, a netbook, a POS machine, or a personal digital assistant (personal digital assistant, PDA).

For ease of description, an example in which the electronic device 10 is a handheld wireless communication device is used for description in all of the following embodiments. The handheld wireless communication device may be a mobile phone.

Figure 2:
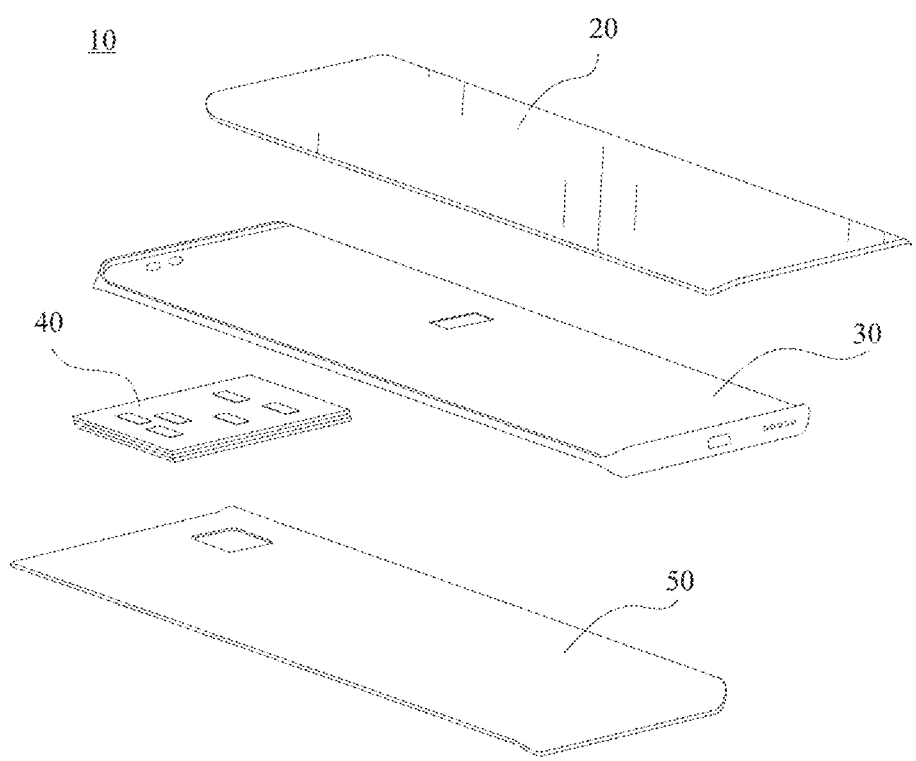
FIG. 2 is a schematic diagram of a breakdown structure of an electronic device according to an embodiment of this application.

FIG. 2 schematically shows a breakdown structure of the electronic device 10 according to an embodiment. As shown in FIG. 2, the electronic device 10 includes a display assembly 20, a middle frame 30, a circuit board assembly 40, and a rear cover 50. The display assembly 20 has a display region for displaying image information. The display region faces away from the middle frame 30, In a power-on state, the display region can display corresponding image information. The middle frame 30 is provided between the display assembly 20 and the rear cover 50 in a thickness direction of the electronic device 10. It should be noted that, the thickness direction of the electronic device 10 refers to an arrangement direction of the display assembly 20 and the rear cover 50. The circuit board assembly 40 is provided in a space formed between the middle frame 30 and the rear cover 50. The circuit board assembly 40 may be provided on a surface of the middle frame 30 that faces the rear cover 50.

Figure 3:
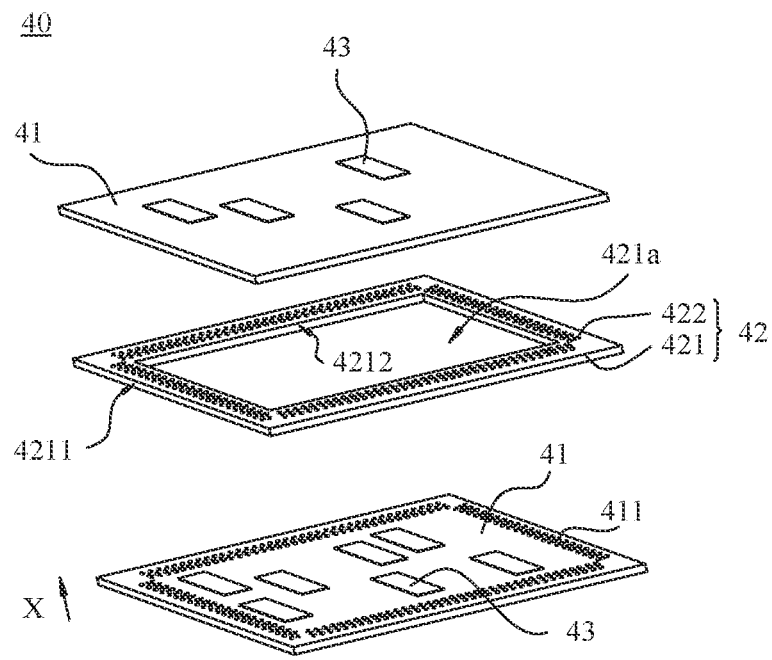
FIG. 3 is a schematic diagram of a breakdown structure of a circuit board assembly according to a related technology.

FIG. 3 schematically shows a breakdown structure of the circuit board assembly 40 in a related technology. As shown in FIG. 3, the circuit board assembly 40 may include circuit boards 41 and a plurality of electronic components 43 electrically connected to the circuit boards 41.

The circuit board 41 in this application may be a printed circuit board (Printed Circuit Board, PCB), a flexible printed circuit (Flexible Printed Circuit, FPC), or an integrated circuit (or referred to as a chip). The circuit board 41 may be a single-sided board or double-sided board. "Single-sided board" means that the electronic components 43 are provided on one side of the circuit board 41 "Double-sided board" means that the electronic components 43 are provided on both sides of the circuit board 41. The circuit board 41 may be a radio frequency (radio frequency, RF) board or an application processor (application processor, AP) board. The radio frequency board may be configured to bear a radio frequency integrated circuit (radio frequency integrated circuit, RFIC), a radio frequency power amplifier (radio frequency power amplifier, RFPA), a wireless fidelity (wireless fidelity, Wi-Fi) chip, and the like, but is not limited thereto. For example, the application processor board may be configured to bear a system on chip (system on chip, SOC) element, a double data rate (double data rate, DDR) memory, a primary power management unit (power management unit, PIM), a secondary power management unit, and the like, but is not limited thereto.

For example, when a thickness of the electronic device 10 is small but the display assembly 20 is large, the circuit board 41 may have a large lateral size, so that one circuit board 41 may be selected for use and a fixed quantity of electronic components 43 may be provided on the circuit board 41. The lateral size refers to a size measured in a direction perpendicular to the thickness direction of the electronic device 10. If the quantity and volumes of the electronic components 43 are large, a structure of the circuit board assembly 40 needs to be optimized when not all of the electronic components 43 can be accommodated on one circuit board 41. For example, a plurality of the circuit boards 41 are stacked along the thickness direction of the electronic device 10, and the electronic components 43 are provided on different circuit boards 41. In this way, an internal space of the electronic device 10 can be fully utilized along the thickness direction of the electronic device 10 to accommodate more and larger electronic components 43.

Figure 4:
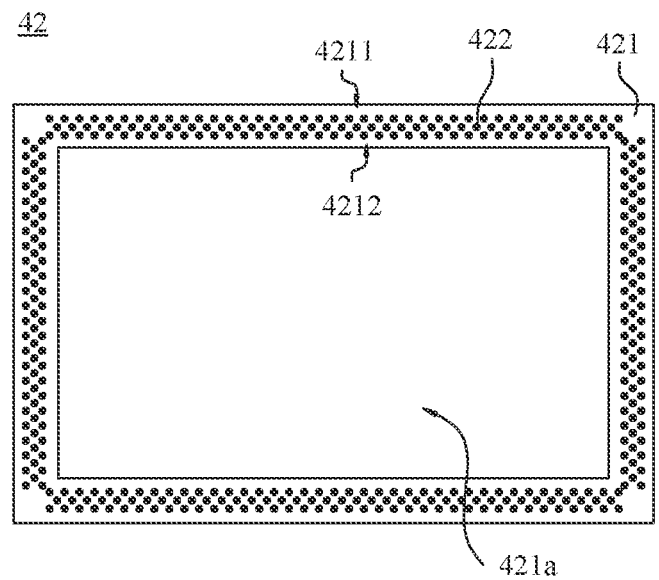
FIG. 4 is a schematic diagram of a top-view structure of a frame plate in the embodiment shown in FIG. 3.
Figure 5:
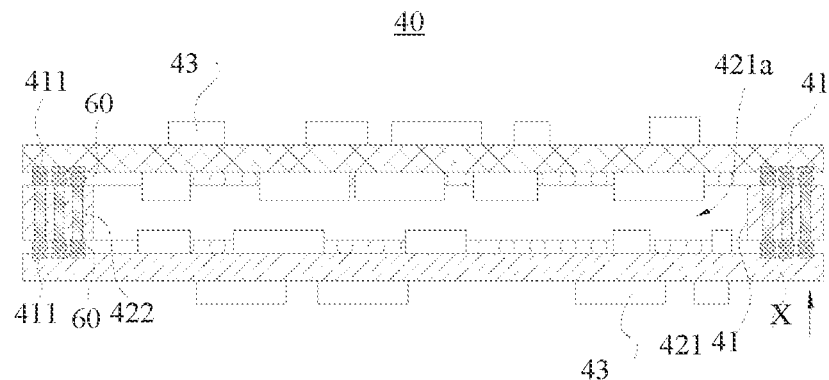
FIG. 5 is a schematic diagram of a cross-sectional structure of the circuit board assembly in the embodiment shown in FIG. 3.

FIG. 4 schematically shows a top-view structure of a frame plate shown in FIG. 3. FIG. 5 schematically shows a partial cross-sectional structure of the circuit board assembly 40 shown in FIG. 3. As shown in FIG. 4 and FIG. 5, in the related technology, the circuit board assembly 40 includes the circuit boards 41 and a frame plate 42. Two circuit boards 41 and the frame plate 42 are stacked along a thickness direction X of the frame plate 42. The frame plate 42 is provided between the two circuit boards 41. The two circuit boards 41 are separately connected to the frame plate 42, so that a predetermined distance is maintained between the two circuit boards 41 and locations of the two circuit boards 41 do not interfere with each other. The two circuit boards 41 may also be electrically connected to each other by using the frame plate 42, so that data information can be mutually transmitted between the two circuit boards 41. The frame plate 42 has an annular structure as a whole, so that the frame plate 42 includes a middle accommodating hole 421a. For example, the frame plate 42 may have a polygonal structure, such as a rectangular structure. After the two circuit boards 41 are connected to the frame plate 42, the electronic components 43 on the two circuit boards 41 may be located in the middle accommodating hole 421a, to avoid locations of the frame plate 42 and the electronic components 43 interfere with each other. A thickness of the frame plate 42 needs to ensure that the electronic components 43 that are located in the middle accommodating hole 421a and that are located on the two circuit boards 41 do not reach contact with each other In some implementations, the frame plate 42 includes a frame body 421 and first soldering portions 422. Along a width direction of the frame plate 42, the frame body 421 has the middle accommodating hole 421a and an outer wall 4211 and an inner wall 4212 that are opposite to each other. It should be noted that, the outer wall 4211 of the frame body 421 refers to a region of the frame body 421 that faces away from the middle accommodating hole 421a. The inner wall 4212 of the frame body 421 refers to a region of the frame body 421 that faces the middle accommodating hole 421a. The width direction of the frame plate 42 refers to a direction from the outer wall 4211 to the inner wall 4212, The frame body 421 further has an intermediate region 4213 between the outer wall 4211 and the inner wall 4212. A material of the frame body 421 is an insulating material such as phenolic resin, epoxy resin, or polytetrafluoroethylene. The first soldering portions 422 are provided in the intermediate region 4213 of the frame body 421. A predetermined distance is maintained between the outer wall 4211 and the first soldering portions 422. A predetermined distance is also maintained between the inner wall 4212 and the first soldering portions 422. The first soldering portions 422 are exposed on two opposite surfaces of the frame body 421 along the thickness direction X of the frame plate 42.

The circuit board 41 may be soldered to the first soldering portions 422 by using solder joints. A shape of the solder joint may be but is not limited to a spherical shape, an ellipsoidal shape, a cylindrical shape, or a truncated-cone shape. The first soldering portions 422 include functional pads and non-functional pads. The functional pads can play an electrical connection function and a mechanical fastening function. After the two circuit boards 41 are connected to the frame plate 42, the two circuit boards 41 can transmit electrical signals to each other by using the functional pads. The non-functional pads can play a mechanical fastening function, but the two circuit boards 41 cannot transmit electrical signals to each other by using the non-functional pads.

In some implementations, the frame body 421 is provided with the non-functional pads in a region close to the outer wall 4211 or the inner wall 4212. For example, the frame body 421 is an annular structure. A circle of non-functional pads close to the outer wall 4211 and a circle of non-functional pads close to the inner wall 4212 may be provided in the intermediate region 4213 of the frame body 421, and a circle of functional pads may be provided between the two circles of non-functional pads.

Stability of a connection between the frame plate 42 and the circuit board 41 in the circuit board assembly 40 affects performance and a service life of the circuit board assembly 40. For example, when the electronic device 10 encounters an uneven force upon a drop, a collision, or the like, no fracture or separation can occur at a connection joint between the frame plate 42 and the circuit board 41 in the circuit board assembly 40. If a fracture or separation occurs at the connection joint between the frame plate 42 and the circuit board 41, the circuit board assembly 40 fails or malfunctions. However, in the related technology, the circuit board 41 is connected to the frame plate 42 by using the first soldering portions 422 provided in the intermediate region 4213 of the frame plate 42, but outer or inner edges of the circuit board 41 and the frame plate 42 are in a disconnected state. Therefore, when the electronic device 10 encounters a drop or a collision, the circuit board 41 and the frame plate 42 together apply a shear force or a drawing force to the first soldering portions 422. Consequently, connection joints between the first soldering portions 422 and the solder joints or between the pads and the solder joints need to bear a large external force. As a result, the circuit board 422 is easily separated from the first soldering portions 422 or the frame plate 422 is easily separated from the first soldering portions 422. In some related technologies, a width of the frame body 421 is properly increased to improve connection strength between the frame plate 42 and the circuit board 41, so that a larger quantity of first soldering portions 422 can be provided on the frame body 421, thereby increasing a connection force between the circuit board 41 and the frame plate 42. It should be noted that, the connection force refers to a force that needs to be overcome for the circuit board 41 to be separated from the frame plate 42. The force required for separating the circuit board 41 from the frame plate 42 refers to a tensile stress, in a direction away from the frame plate 42, that is applied to the circuit board 41 along the thickness direction X of the frame plate 42 and that is required for separating the circuit board 41 from the frame plate 42. However, when the width of the frame body 421 is designed to be large, an area of a region available for mounting the electronic components 43 on the circuit board 41 of a same size becomes smaller because the electronic components 43 cannot be provided in a region in which the circuit board 41 is connected to the frame plate 42, causing a decrease in overall utilization of the circuit board 41.

According to the circuit board assembly 40 in this embodiment of this application, providing the second soldering portions 423 on the frame body 421 can increase the connection force between the frame plate 42 and the circuit board 41 without increasing the width of the frame body 421, thereby improving the stability and reliability of the connection between the frame plate 42 and the circuit board 41, and reducing a possibility of separation between the frame plate 42 and the circuit board 41 when the electronic device 10 encounters an uneven force upon a drop, a collision, or the like.

The following further describes an implementation of the circuit board assembly 40 provided in this embodiment of this application.

Figure 6:
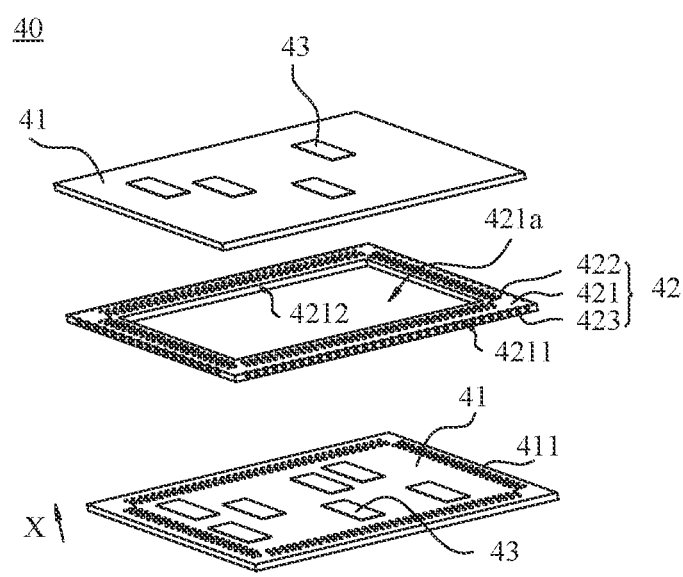
FIG. 6 is a schematic diagram of a breakdown structure of a circuit board assembly according to an embodiment of this application.
Figure 7:
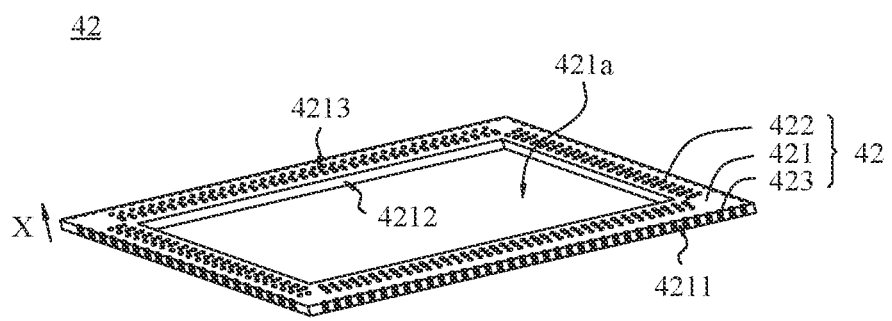
FIG. 7 is a schematic diagram of a structure of a frame plate according to an embodiment of this application.
Figure 8:
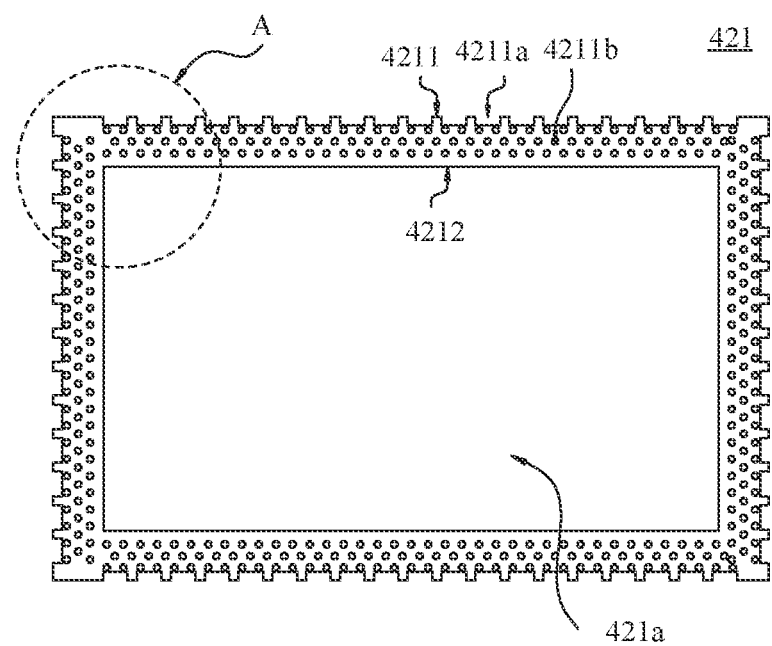
FIG. 8 is a schematic diagram of a top-view structure of a frame body according to an embodiment of this application.
Figure 9:
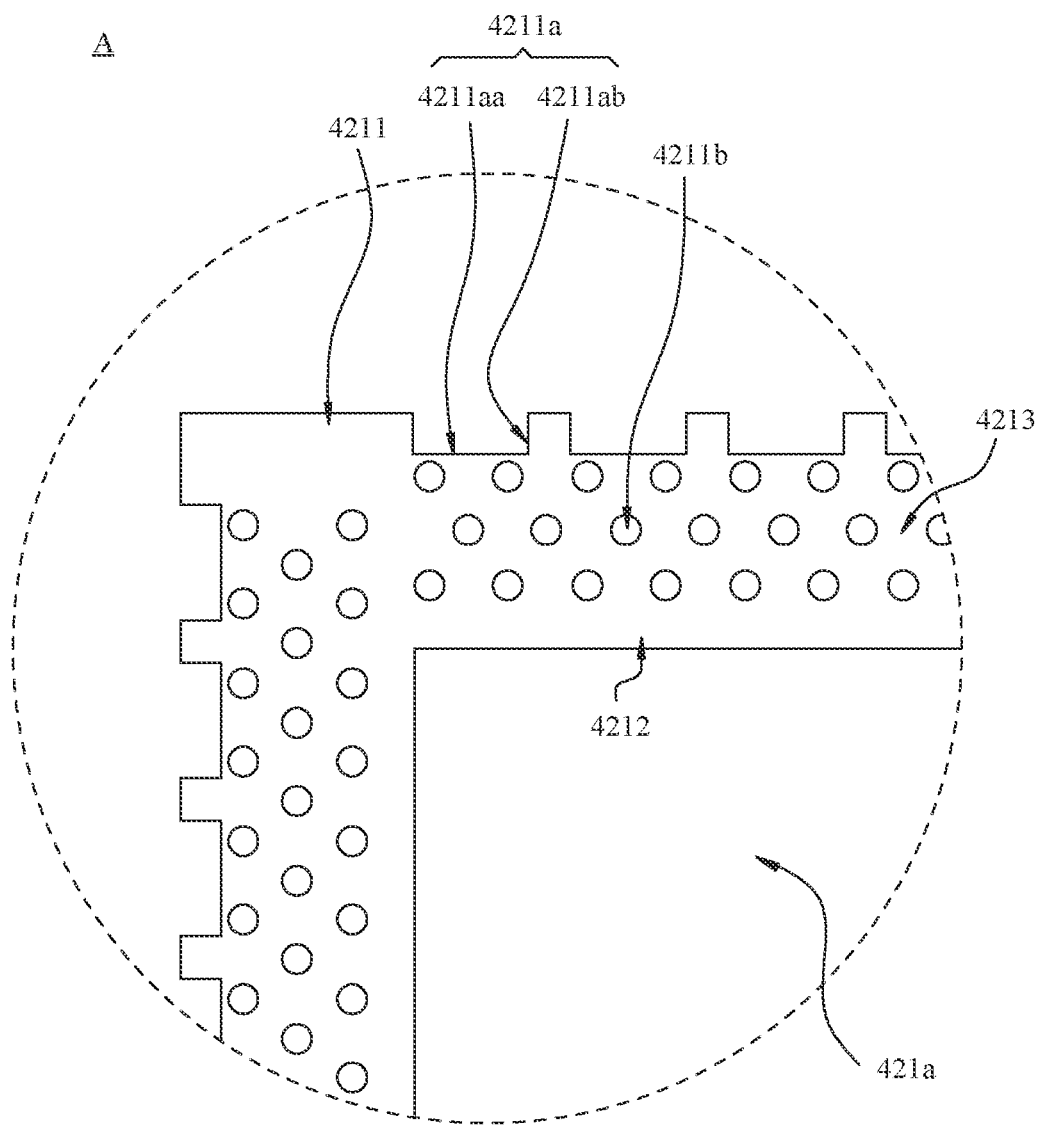
FIG. 9 is an enlarged view of a location A in FIG. 8.

FIG. 6 schematically shows a breakdown structure of the circuit board assembly 40 according to an embodiment of this application. FIG. 7 schematically shows a structure of a frame plate 42 in this embodiment of this application. As shown in FIG. 6 and FIG. 7, the circuit board assembly 40 in this embodiment of this application is used in the electronic device 10. The circuit board assembly 40 includes the frame plate 42 and circuit boards 41. The frame plate 42 is a plate-shaped structure with a predetermined thickness. In a thickness direction X of the frame plate 42, two circuit boards 41 are respectively provided on both sides of the frame plate 42, and the two circuit boards 41 are separately connected to the frame plate 42. The frame plate 42 is located between the two circuit boards 41. The frame plate 42 includes a frame body 421, first soldering portions 422, and second soldering portions 423. The frame body 421 has two surfaces that are opposite to each other along the thickness direction X. The frame body 421 includes a middle accommodating hole 421a that runs through both surfaces along the thickness direction X. The frame body 421 includes an outer wall 4211 and an inner wall 4212 that are provided opposite to each other along a width direction. On the frame body 421, the inner wall 4212 faces the middle accommodating hole 421a, and the outer wall 4211 faces away from the middle accommodating hole 421a. A region between the inner wall 4212 and the outer wall 4211 of the frame body 421 is an intermediate region 4213. The first soldering portions 422 are provided in the intermediate region 4213 of the frame body 421. At least one of the inner wall 4212 and the outer wall 4211 of the frame body 421 is provided with accommodating grooves 4211a. It should be noted that, that at least one of the inner wall 4212 and the outer wall 4211 of the frame body 421 is provided with accommodating grooves 4211a includes an implementation in which only the inner wall 4212 is provided with accommodating grooves 4211a, only the outer wall 4211 is provided with accommodating grooves 4211a, or both the inner wall 4212 and the outer wall 4211 are provided with accommodating grooves 4211a. FIG. 8 schematically shows a top-view structure of the frame body 421 according to an embodiment of this application. As shown in FIG. 8 and FIG. 9, when the outer wall 4211 of the frame body 421 is provided with accommodating grooves 4211a, the accommodating grooves 4211a each have an opening facing away from the middle accommodating hole 421a. When the inner wall 4212 of the frame body 421 is provided with accommodating grooves 4211a, the accommodating grooves 4211a each have an opening facing the middle accommodating hole 421a. The accommodating grooves 4211a extend along the thickness direction X. For example, the accommodating grooves 4211a may run through the two surfaces of the frame body 421 that are opposite to each other along the thickness direction X.

The second soldering portions 423 are provided in the accommodating grooves 4211a and connected to the frame body 421. When the second soldering portions 423 are correspondingly provided in the accommodating grooves 4211a on the outer wall 4211, the second soldering portions 423 can be observed from an outer side of the frame plate 42. When the second soldering portions 423 are correspondingly provided in the accommodating grooves 4211a on the inner wall 4212, the second soldering portions 423 can be observed from an inner side of the frame plate 42. The circuit board 41 includes pads 411. The first soldering portions 422 and the second soldering portions 423 are respectively soldered to corresponding pads 411 on the circuit board 41.

The circuit board assembly 40 in this embodiment of this application includes the frame plate 42 and the circuit boards 41. The frame plate 42 includes the frame body 421, the first soldering portions 422 located in the intermediate region 4213, and the second soldering portions 423 located on at least one of the outer wall 4211 and the inner wall 4212. When a width of the frame body 421 can be kept unchanged, density of connection points formed by the first soldering portions 422 and the second soldering portions 423 provided on the frame body 421 is higher. The circuit board 41 is connected to the frame plate 42 by using the first soldering portions 422 and the second soldering portions 423, so that edge regions of the circuit board 41 and the frame plate 42 are in a connected state. In addition, a connection force between the circuit board 41 and the frame plate 42 is increased due to an increase of the connection points between the circuit board 41 and the frame plate 42. When the circuit board assembly 40 encounters an uneven force upon a drop, a collision, or the like, the first soldering portions 422 and the second soldering portions 423 between the circuit board 41 and the frame plate 42 can buffer the force, thereby effectively reducing a possibility of separation between the circuit board 41 and the frame plate 42.

Figure 10:
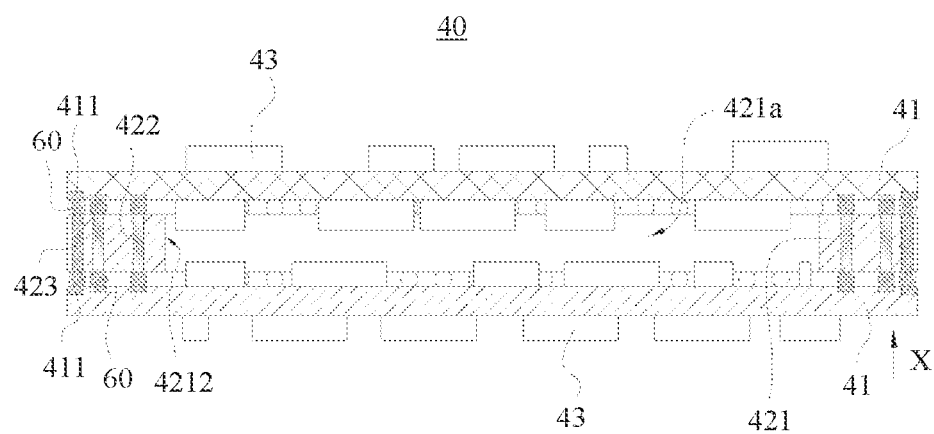
FIG. 10 is a schematic diagram of a cross-sectional structure of a circuit board assembly according to an embodiment of this application.

FIG. 10 schematically shows a partial cross-sectional structure of the circuit board assembly 40 according to an embodiment of this application. As shown in FIG. 10, the first soldering portions 422 and the second soldering portions 423 of the frame plate 42 are respectively, soldered to the corresponding pads 411 on the circuit board 41 by using solder joints 60. For example, materials of the first soldering portions 422 and the second soldering portions 423 may be copper or a copper alloy. A material of the pads 411 of the circuit board 41 may be copper or a copper alloy. When the circuit board 41 needs to be connected to the frame plate 42, solder paste is printed on the first soldering portions 422 and the second soldering portions 423 in advance. The solder paste may include tin and a solder flux. Then, the circuit board 41 is provided on one side of the frame plate 42 and made to reach contact with the solder paste. The solder paste is heated and melted, so that the first soldering portions 422, the second soldering portions 423, and the pads 411 are all connected to the molten solder paste. After the molten solder paste is cured, the solder joints 60 are formed, so that the circuit board 41 is connected to the frame plate 42 by using the solder joints 60. Since the circuit board 41 is supported by the solder joints 60, a gap is formed between a surface of the circuit board 41 that faces the frame plate 42 and a surface of the frame plate 42 that faces the circuit board 41. For example, along the thickness direction X, the solder joints 60 are provided between the first soldering portions 422 and the pads 411, and between the second soldering portions 423 and the pads 411.

Figure 11:
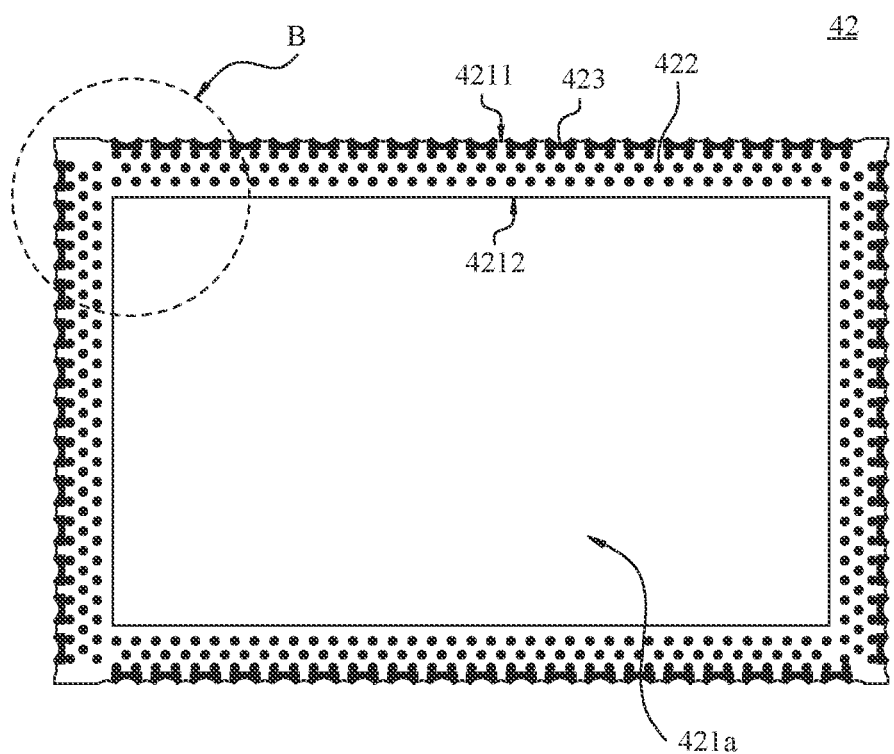
FIG. 11 is a schematic diagram of a top-view structure of a frame plate according to an embodiment of this application.
Figure 12:
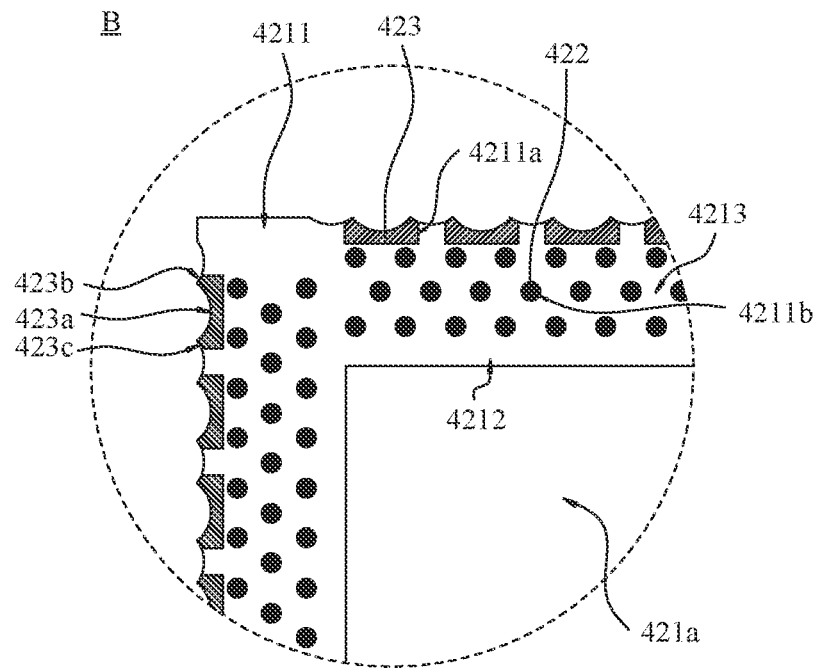
FIG. 12 is an enlarged view of a location B in FIG. 11.

FIG. 11 schematically shows a top-view structure of the frame body 421 according to an embodiment of this application. As shown in FIG. 11 and FIG. 12, the frame plate 42 is an annular structure, for example, a rectangular structure. Along a circumferential direction of the frame plate 42, two or more accommodating grooves 4211a are provided on the outer wall 4211 of the frame body 421, and the two or more accommodating grooves 4211a are evenly distributed, so that a spacing between every two adjacent accommodating grooves 4211a is equal. For example, the accommodating grooves 4211a may be formed on the frame body 421 through processing in a finish machining manner, for example, by using a drilling tool or a milling cutter. It should be noted that, the circumferential direction of the frame plate 42 refers to a direction around the middle accommodating hole 421a. A quantity and locations of the second soldering portions 423 one-to-one correspond to a quantity and locations of the accommodating grooves 4211a. Two or more second soldering portions 423 are also evenly distributed along the circumferential direction of the frame plate 42. Therefore, soldering all the second soldering portions 423 to the corresponding pads 411 on the circuit board 41 is advantageous to improving a force balance of the circuit board 41 at each location, and reducing a possibility of local warpage of the circuit board 41 due to an unbalanced connection force between the circuit board 41 and the frame plate 42 at different locations.

Figure 13:
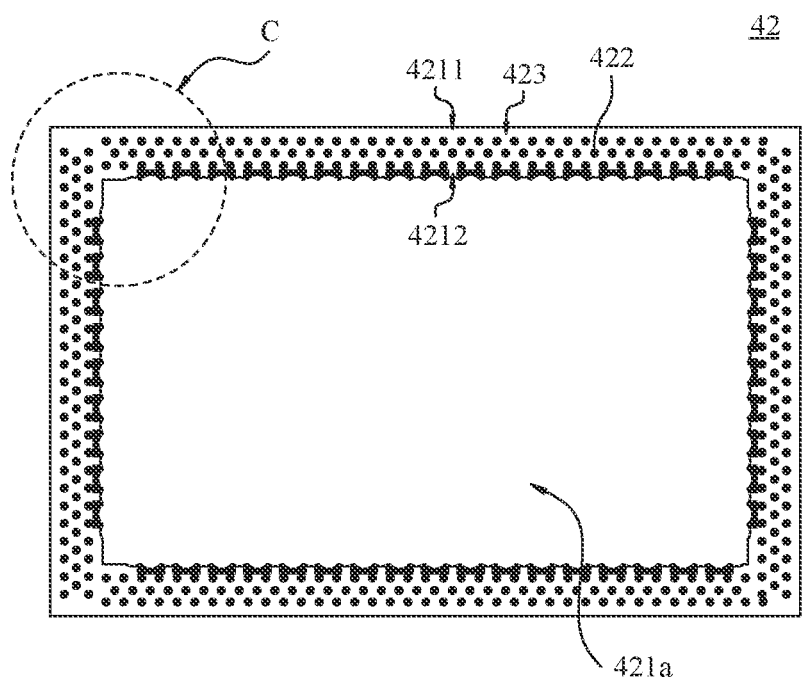
FIG. 13 is a schematic diagram of a top-view structure of a frame plate according to another embodiment of this application.
Figure 14:
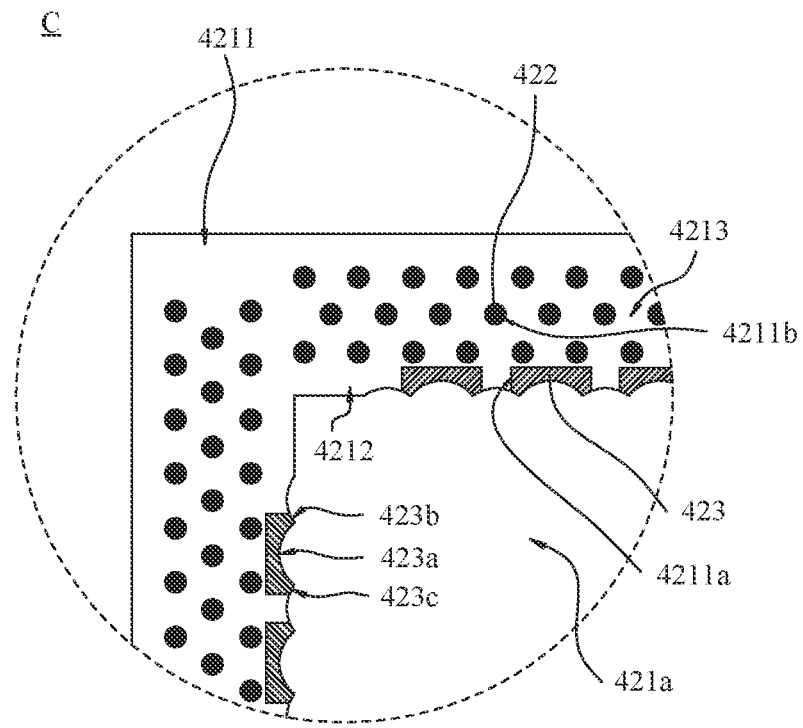
FIG. 14 is an enlarged view of a location C in FIG. 13.

FIG. 13 schematically shows a top-view structure of the frame plate 42 according to an embodiment of this application. As shown in FIG. 13 and FIG. 14, along a circumferential direction of the frame plate 42, two or more accommodating grooves 4211a are provided on the inner wall 4212 of the frame body 421, and the two or more accommodating grooves 4211a are evenly distributed, so that a spacing between every two adjacent accommodating grooves 4211a is equal. For example, the accommodating grooves 4211a may be formed on the frame body 421 through processing in a finish machining manner, for example, by using a drilling tool or a milling cutter. A quantity and locations of the second soldering portions 423 one-to-one correspond to a quantity and locations of the accommodating grooves 4211a. Two or more second soldering portions 423 are also evenly distributed along the circumferential direction of the frame plate 42. Therefore, soldering all the second soldering portions 423 to the corresponding pads 411 on the circuit board 41 is advantageous to improving a force balance of the circuit board 41 at each location, and reducing a possibility of local warpage of the circuit board 41 due to an unbalanced connection force between the circuit board 41 and the frame plate 42 at different locations.

Figure 15:
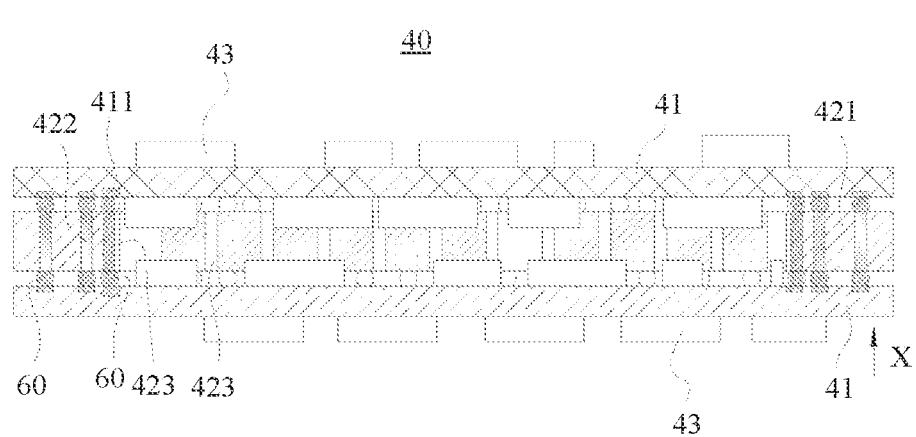
FIG. 15 is a schematic diagram of a cross-sectional structure of a circuit board assembly according to another embodiment of this application.

FIG. 15 schematically shows a partial cross-sectional structure of the circuit board assembly 40 according to an embodiment of this application. As shown in FIG. 15, the second soldering portions 423 provided on the inner wall 4212 are connected to the corresponding pads 411 on the circuit board 41 by using the solder joints 60, so that an inner edge of the frame plate 42 is connected to the circuit board 41. The first soldering portions 422 provided in the intermediate region 4213 and the second soldering portions 423 provided on the inner wall 4212 are all connected to the circuit board 41. This improves connection strength between the circuit board 41 and the frame plate 42, and helps improve stability and reliability of the connection between the circuit board 41 and the frame plate 42.

Figure 16:
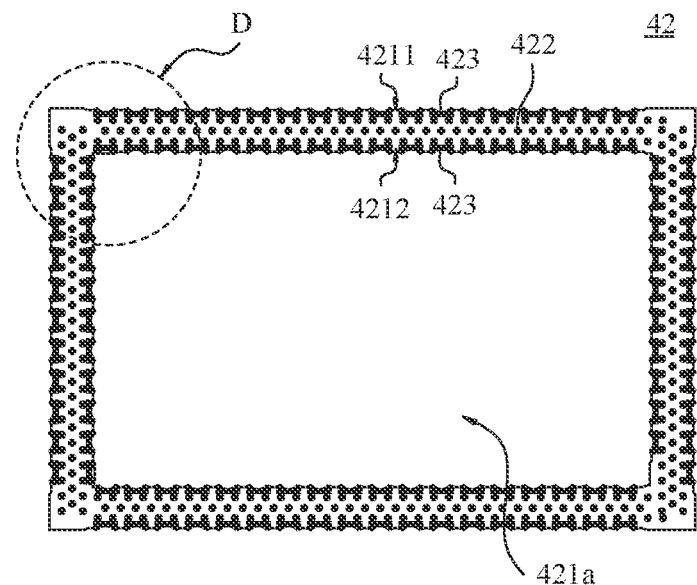
FIG. 16 is a schematic diagram of a top-view structure of a frame plate according to still another embodiment of this application.
Figure 17:
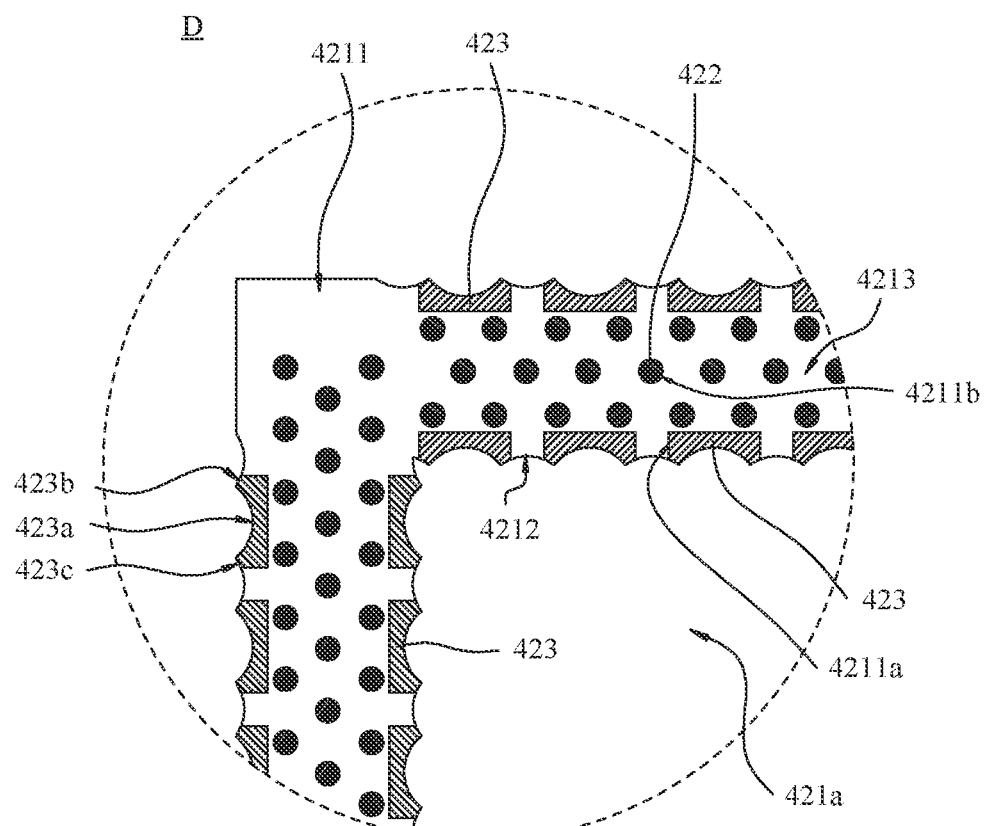
FIG. 17 is an enlarged view of a location D in FIG. 16.

FIG. 16 schematically shows a top-view structure of the frame plate 42 according to an embodiment of this application. As shown in FIG. 16 and FIG. 17, the inner wall 4212 and the outer wall 4211 of the frame body 421 each are provided with the accommodating grooves 4211a, so that the second soldering portion 423 is provided in each accommodating groove 4211a. This further helps increase the density of the connection points formed by the first soldering portions 422 and the second soldering portions 423 on the frame plate 421. The second soldering portions 423 in the accommodating grooves 4211a on the inner wall 4212 of the frame body 421 may be soldered to the corresponding pads 411 on the circuit board 41, so that an inner edge of the frame plate 42 is connected to the circuit board 41. The second soldering portions 423 in the accommodating grooves 4211a on the outer wall 4211 of the frame body 421 may be soldered to the corresponding pads 411 on the circuit board 41, so that an outer edge of the frame plate 42 is connected to the circuit board 41. Therefore, both the inner edge and the outer edge of the frame plate 42 can be connected to the circuit board 41. This further helps increase the connection force between the circuit board 41 and the frame plate 42, and improve the stability and reliability of the connection between the circuit board 41 and the frame plate 42.

In some examples, the quantity and locations of the accommodating grooves 4211a on the outer wall 4211 one-to-one correspond to the quantity and locations of the accommodating grooves 4211a on the inner wall 4212, so that the accommodating grooves 4211a on the outer wall 4211 correspond to the accommodating grooves 4211a on the inner wall 4212 along the width direction of the frame plate 42. In some other examples, the accommodating grooves 4211a on the outer wall 4211 may be staggered from the accommodating grooves 4211a on the inner wall 4212, so that one accommodating groove 4211a on the outer wall 4211 corresponds to a region between two accommodating grooves 4211a on the inner wall 4212 along the width direction of the frame plate 42.

As shown in FIG. 17, through holes 4211b are provided in the intermediate region 4213 of the frame body 421. The through holes 4211b run through the two opposite surfaces of the frame body 421 along the thickness direction X of the frame plate 42. The first soldering portions 422 are correspondingly provided in the through holes 4211b. For example, the through holes 4211b are circular holes. For example, the through holes 4211b may be formed on the frame body 421 through processing in a finish machining manner, for example, by drilling.

In some examples, the intermediate region 4213 of the frame body 421 is provided with two or more rows of through holes 4211b. Each through hole 4211b is correspondingly provided with the first soldering portion 422 so that two or more rows of first soldering portions 422 are formed correspondingly. The two or more rows of through holes 4211b are spaced along the width direction of the frame plate 42. For example, in the embodiment in which the outer wall 4211 of the frame body 421 is provided with accommodating grooves 4211a, in one row of through holes 4211b close to the outer wall 4211, one accommodating groove 4211a on the outer wall 4211 is provided corresponding to two through holes 4211b, so that one second soldering portion 423 is provided corresponding to two first soldering portions 422. In the embodiment in which the inner wall 4212 of the frame body 421 is provided with accommodating grooves 4211a, in one row of through holes 4211b close to the inner wall 4212, one accommodating groove 4211a on the inner wall 4212 is provided corresponding to two through holes 4211b, so that one second soldering portion 423 is provided corresponding to two first soldering portions 422. After one second soldering portion 423 and the two corresponding first soldering portions 42 are respectively connected to corresponding pads 411 of the circuit board 41, a connection point formed by the second soldering portion 423 and the pad 411 and connection points formed by the first soldering portions 422 and the pads 411 form a triangular layout, which helps improve the stability of the connection between the circuit board 41 and the frame plate 42. In the circumferential direction of the frame plate 42, neither of the two first soldering portions 422 respectively exceed edges of the corresponding second soldering portion 423.

In some examples, as shown in FIG. 17, a quantity and locations of the accommodating grooves 4211a on the outer wall 4211 one-to-one correspond to a quantity and locations of the accommodating grooves 4211a on the inner wall 4212. Three rows of through holes 4211b are provided in the intermediate region 4213 of the frame plate 42. Along the width direction of the frame plate 42, centers of the one row of through holes 4211b close to the outer wall 4211 are aligned with centers of the one row of through holes 4211b close to the inner wall 4212. The centers of the one row of through holes 4211b close to the outer wall 4211 and centers of one row of through holes 4211b in the middle are staggered from each other. Similarly, the centers of the one row of through holes 4211b close to the inner wall 4212 are also staggered from the centers of the one row of through holes 4211b in the middle. For example, the first soldering portions 422 provided in the one row of through holes 4211b close to the outer wall 4211 and the one row of through holes 4211b close to the inner wall 4212 may serve as non-functional pads, and the first soldering portions 422 provided in the one row of through holes 4211b in the middle may serve as functional pads.

Figure 18:
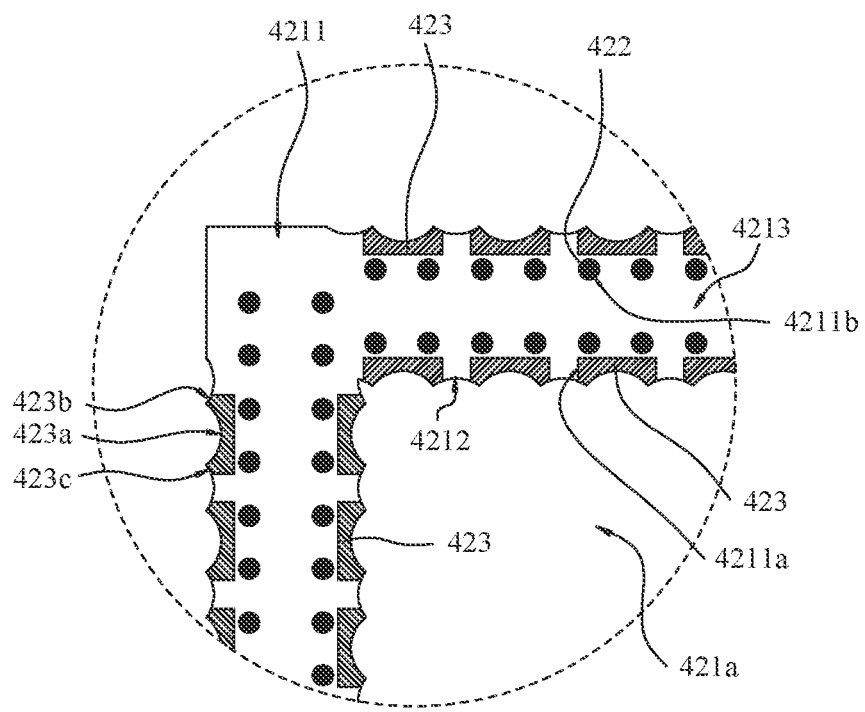
FIG. 18 is a schematic diagram of a local structure of a frame plate according to another embodiment of this application.

In some other examples, as shown in FIG. 18, a quantity and locations of the accommodating grooves 4211a on the outer wall 4211 one-to-one correspond to a quantity and locations of the accommodating grooves 4211a on the inner wall 4212. Two rows of through holes 4211b are provided in the intermediate region 4213 of the frame plate 42. Along the width direction of the frame plate 42, centers of one row of through holes 4211*b* are aligned with centers of the other row of through holes 4211*b*. For example, the first soldering portions 422 provided in the one row of through holes 4211*b* may serve as non-functional pads, and the first soldering portions 422 provided in the other row of through holes 4211*b* may serve as functional pads.

As shown in FIG. 9 and FIG. 17, the accommodating groove 4211*a* includes a bottom surface 4211*aa* and side surfaces 4211*ab*. The bottom surface 4211*aa* of the accommodating groove 4211*a* intersects the side surfaces 4211*ab* thereof. For example, an included angle between the bottom surface 4211*aa* and the side surface 4211*ab* of the accommodating groove 4211*a* may range from 90° to 110°. A depth of the accommodating groove 4211*a* may be, but is not limited to, 0.2 mm. The depth of the accommodating groove 4211*a* refers to a vertical distance from the bottom surface 4211*aa* to an opening of the accommodating groove 4211*a*. A shape of a surface of the second soldering portion 423 that faces the bottom surface 4211*aa* matches a shape of the bottom surface 4211*aa*. A shape of a surface of the second soldering portion 423 that faces the side surface 4211*ab* matches a shape of the side surface 4211*ab*. Therefore, the surface of the second soldering portion 423 that faces the accommodating groove 4211*a* can fit tightly with the surface of the accommodating groove 4211*a*. This helps increase a bonding force between the surface of the second soldering portion 423 and the surface of the accommodating groove 4211*a*, and reduce a possibility that the circuit board 41 fails to be connected to the frame plate 42 by using the second soldering portion 423 due to separation between the surface of the second soldering portion 423 and the surface of accommodating groove 4211*a*.

As shown in FIG. 17, surfaces of the second soldering portion 423 that face away from the middle accommodating hole 421*a* include a first concave surface 423*a*, a second concave surface 423*b*, and a third concave surface 423*c*. Regions corresponding to the first concave surface 423*a*, the second concave surface 423*b*, and the third concave surface 423*c* may be configured to avoid the electronic components 43. The first concave surface 423*a*, the second concave surface 423*h*, and the third concave surface 423*c* are depressed towards the intermediate region 4213. The second concave surface 423*b* and the third concave surface 423*c* are respectively located on both sides of the first concave surface 423*a* along the circumferential direction of the frame plate 42. An intersecting region between the first concave surface 423*a* and the second concave surface 423*b* and an intersecting region between the first concave surface 423*a* and the third concave surface 423*c* both exceed the opening of the accommodating groove 4211*a*. In some examples, when depression depths of the first concave surface 423*a*, the second concave surface 423*b*, and the third concave surface 423*c* are the same, the region between the first concave surface 423*a* and the second concave surface 423*b* and the region between the first concave surface 423*a* and the third concave surface 423*c* are thin in size and form relatively sharp structures, and therefore are easily broken when subjected to impact of an external force. The depression depth of the second concave surface 423*b* and the depression depth of the third concave surface 423*c* each are less than the depression depth of the first concave surface 423*a*. This helps increase sizes of the region between the first concave surface 423*a* and the second concave surface 423*b* and the region between the first concave surface 423*a* and the third concave surface 423*c*, and reduce a possibility of facture occurring upon impact of an external force. In some examples, the first concave surface 423*a*, the second concave surface 423*b*, and the third concave surface 423*c* are all arc surfaces. For example, a central angle corresponding to the first concave surface 423*a* is 60° to 120°. The first concave surface 423*a*, the second concave surface 423*b*, and the third concave surface 423*c* have a same radius. Therefore, for example, when the first concave surface 423*a*, the second concave surface 423*b*, and the third concave surface 423*c* are processed and manufactured by drilling or milling, it is convenient to use a tool with one diameter for cutting. This reduces a possibility that a processing operation is complex and processing efficiency is low due to a need of replacing tools with different diameters.

Figure 19:
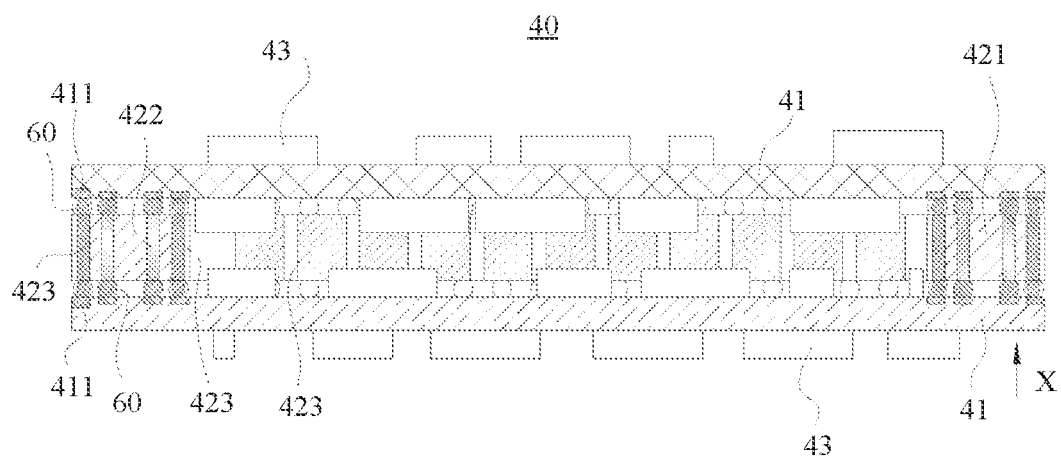
FIG. 19 is a schematic diagram of a cross-sectional structure of a, circuit board assembly according to still another embodiment of this application.

FIG. 19 schematically shows a partial cross-sectional structure of the circuit board assembly 40 according to an embodiment of this application. As shown in FIG. 19, the second soldering portions 423 on the outer wall 4211 and the inner wall 4212 are respectively connected to the corresponding pads 411 on the circuit board 41 by using the solder joints 60, so that both the outer edge and the inner edge of the frame plate 42 are connected to the circuit board 41. The first soldering portions 422 provided in the intermediate region 4213 and the second soldering portions 423 provided on the outer wall 4211 and the inner wall 4212 are all connected to the circuit board 41. This improves connection strength between the circuit board 41 and the frame plate 42, and helps improve stability and reliability of the connection between the circuit board 41 and the frame plate 42.

Figure 20:
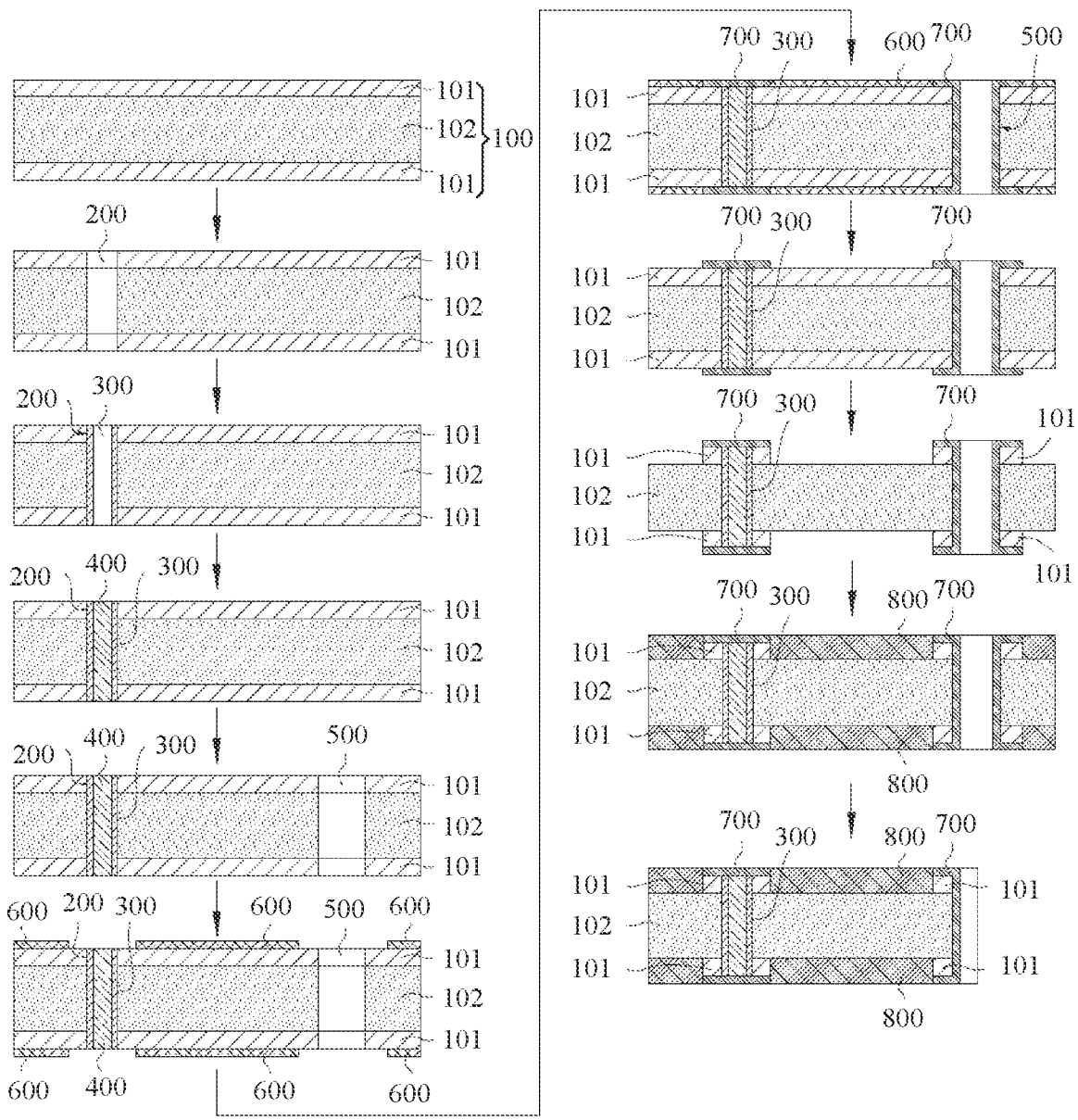
FIG. 20 is a schematic diagram of a manufacturing method for a frame plate according to an embodiment of this application.

FIG. 20 schematically shows a procedure of a manufacturing method for the frame plate 42 according to an embodiment of this application. As shown in FIG. 20, an embodiment of this application further provides a manufacturing method for the frame plate 42. The manufacturing method includes the following steps:

A copper clad substrate 100 is provided, where the copper clad substrate 100 includes copper clad layers 101 and a dielectric layer 102, and the copper clad layers 101 are respectively, provided on both sides of the dielectric layer 102.

A hole is drilled in the copper clad substrate 100 to form a first via 200.

A first copper layer 300 is formed on an inner wall of the first via 200, and the first copper layer 300 is electrically connected to the copper clad layers 101 on both sides.

A central hole of the first copper layer 300 is filled with a resin block 400.

A hole is drilled in the copper clad substrate 100 to form a second via 500, where the first via 200 and the second via 500 are spaced apart.

An anti-electroplating film 600 is provided on a surface of the copper dad layer 101.

A second copper layer is formed on an inner wall of the second via 500 and on the surface of the copper clad layer 101 by successively using a chemical plating process and an electroplating process.

The anti-electroplating film 600 is removed.

The copper clad layer 101 and the second copper layer 700 on the surface of the copper clad layer 101 are patterned by using an etching process.

A solder-resist material layer 800 is provided in an etched region.

The copper-clad substrate 100 is cut into a frame plate 42 with a predetermined shape by using a finish machining-based contour processing process. After the processing is completed, portions of the second via 500 and the second copper layer 700 are cut off. The first via 200 forms a through hole 4211*b*, and the copper dad layer 101, the first copper layer 300, and the second copper layer 700 that correspond to the first via 200 form a first soldering portion 422. A remaining portion of the second via 500 forms an accommodating groove 4211*a*, and the copper clad layer 101 and the second copper layer 700 that correspond to the remaining portion of the second via 500 form a second soldering portion 423.

In some implementations, the copper clad layer 101 and the second copper layer 700 on the surface of the copper clad layer 101 are patterned by using an alkaline etching solution in an etching process, to form corresponding routes. The finish machining-based contour processing process may be drilling or milling. The frame plate 42 with the predetermined shape may be rectangular or square.

In some implementations, the manufacturing method for the frame plate 42 in this embodiment of this application is used to manufacture the frame plate 42 in the foregoing embodiments.

In the description of the embodiments of this application, it should be noted that, the terms "mounting", "connection", and "connect" should be understood in a broad sense unless otherwise expressly stipulated and limited. For example, "connection" may be a fixed connection, an indirect connection through an intermediate medium, internal communication between two elements, or an interaction relationship between two elements. For a person of ordinary skill in the art, specific meanings of the foregoing terms in the embodiments of this application can be understood based on specific situations.

In the description of the embodiments of this application, it should be understood that directions or positional relationships indicated by direction-related descriptions such as "up", "down", "left", and "right" are based on directions or positional relationships shown by the accompanying drawings, which are used only for describing the embodiments of this application and for description brevity, but do not indicate or imply that an indicated apparatus or element must have a specific direction or must be constructed and operated in a specific direction. Therefore, this cannot be understood as a limitation on the embodiments of this application. In the description of the embodiments of this application, "a plurality of" means two or more, unless otherwise explicitly and specifically specified.

The terms "first", "second", "third", "fourth", and the like (if any) in this specification, claims, and accompanying drawings of the embodiments of this application are used to distinguish between similar objects without having to describe a specific order or sequence. It should be understood that, data used in this way may be interchanged under appropriate circumstances, so that the embodiments of this application described herein can be implemented in an order other than that illustrated or described herein. In addition, the terms "including" and "having" and any of their variants are intended to cover non-exclusive inclusions. For example, a process, method, system, product, or device that includes a series of steps or units is not necessarily limited to those steps or units clearly listed, and may include other steps or units that are not clearly listed or are inherent to the process, method, product, or device.

The term "a plurality of" in this specification refers to two or more. The term "and/or" in this specification describes only an association relationship for describing associated objects and represents that three relationships can exist. For example, "A and/or B" can represent the following three cases: Only A exists, both A and B exist, and only B exists. In addition, the character "/" in this specification generally indicates an "or" relationship between the associated objects. In a formula, the character "/" indicates that the associated objects are in a "division" relationship.

It can be understood that, in the embodiments of this application, various numeric numbers are distinguished merely for ease of description and are not used to limit the scope of the embodiments of this application.

It can be understood that, in the embodiments of this application, a sequence number of each of the foregoing processes does not mean a sequence of execution. The sequence of execution of the processes should be determined based on functions and internal logic of the processes, and no limitation should be imposed on an implementation process of the embodiments of this application.

What is claimed is:

1. A circuit board assembly, comprising at least the following:
a frame plate, comprising a frame body, first soldering portions, and second soldering portions, wherein the frame body has a middle accommodating hole, an inner wall facing the middle accommodating hole, and an outer wall facing away from the middle accommodating hole, the first soldering portions are provided in an intermediate region located on the frame body between the inner wall and the outer wall, and at least one of the inner wall and the outer wall is provided with accommodating grooves, the accommodating grooves extend along a thickness direction of the frame plate, and the second soldering portions are provided in the accommodating grooves and connected to the frame body; and
two circuit boards that are respectively provided on two opposite sides of the frame plate along the thickness direction, each circuit board of the two circuit boards comprises pads, and the first soldering portions and the second soldering portions are soldered to corresponding pads, respectively, and wherein surfaces of the second soldering portions that face away from the middle accommodating hole comprise a first concave surface, a second concave surface, and a third concave surface; the first concave surface, the second concave surface, and the third concave surface are depressed towards the intermediate region; the second concave surface and the third concave surface are respectively located on both sides of the first concave surface along a circumferential direction of the frame plate; and an intersecting region between the first concave surface and the second concave surface and an intersecting region between the first concave surface and the third concave surface both exceed an opening of the accommodating groove.

2. The circuit board assembly according to claim 1, wherein the accommodating groove comprises a bottom surface and side surfaces, the bottom surface intersects the side surfaces, a shape of a surface of the second soldering portion that faces the bottom surface matches a shape of the bottom surface, and a shape of a surface of the second soldering portion that faces the side surface matches a shape of the side surface.

3. The circuit board assembly according to claim 2, wherein an included angle between the bottom surface and the side surface of the accommodating groove ranges from 90° to 110°.

4. The circuit board assembly according to claim 1, wherein the accommodating groove runs through two surfaces of the frame body that are opposite to each other along the thickness direction.

5. The circuit board assembly according to claim 1, wherein the first soldering portions and the second soldering portions are respectively soldered to the corresponding pads on the circuit board by using solder joints.

6. The circuit board assembly according to claim 1, wherein a depression depth of the second concave surface and a depression depth of the third concave surface each are less than a depression depth of the first concave surface.

7. The circuit board assembly according to claim 1, wherein the first concave surface, the second concave surface, and the third concave surface are all arc surfaces.

8. The circuit board assembly according to claim 7, wherein a central angle corresponding to the first concave surface is 60° to 120°.

9. The circuit board assembly according to claim 7, wherein the first concave surface, the second concave surface, and the third concave surface have a same radius.

10. The circuit board assembly according to claim 1, wherein along the circumferential direction of the frame plate, two or more accommodating grooves are evenly distributed, and two or more second soldering portions are evenly distributed.

11. The circuit board assembly according to claim 1, wherein the inner wall and the outer wall each are provided with the accommodating grooves.

12. The circuit board assembly according to claim 11, wherein a quantity and locations of the accommodating grooves on the outer wall one-to-one correspond to a quantity and locations of the accommodating grooves on the inner wall.

13. The circuit board assembly according to claim 11, wherein two or more rows of through holes are provided in the intermediate region; each of the through holes is correspondingly provided with the first soldering portion; the two or more rows of through holes are spaced along a width direction of the frame plate; in one row of the through holes close to the outer wall, one of the accommodating grooves on the outer wall is provided corresponding to two of the through holes; and in one row of the through holes close to the inner wall, one of the accommodating grooves on the inner wall is provided corresponding to two of the through holes.

14. An electronic device, comprising:
a middle frame; and
a circuit board assembly, wherein the circuit board assembly comprising at least the following:
a frame plate, comprising a frame body, first soldering portions, and second soldering portions, wherein the frame body base a middle accommodating hole, an inner wall facing the middle accommodating hole, and an outer wall facing away from the middle accommodating hole, the first soldering portions are provided in an intermediate region located on the frame body between the inner wall and the outer wall, and at least one of the inner wall and the outer wall is provided with accommodating grooves, the accommodating grooves extend along a thickness direction of the frame plate, and the second soldering portions are provided in the accommodating grooves and connected to the frame body; and
two circuit boards that are respectively provided on two opposite sides of the frame plate along the thickness direction, each circuit board of the two circuit boards comprises pads, and the first soldering portions and the second soldering portions are soldered to corresponding pads, respectively, and wherein surfaces of the second soldering portions that face away from the middle accommodating hole comprise a first concave surface, a second concave surface, and a third concave surface; the first concave surface, the second concave surface, and the third concave surface are depressed towards the intermediate region; the second concave surface and the third concave surface are respectively located on both sides of the first concave surface along a circumferential direction of the frame plate; and an intersecting region between the first concave surface and the second concave surface and an intersecting region between the first concave surface and the third concave surface both exceed an opening of the accommodating groove.

15. The electronic device according to claim 14, wherein the circuit board assembly is provided on a surface of the middle frame.

16. The electronic device according to claim 15, wherein the surface of the middle frame faces a rear cover.

17. The electronic device according to claim 14, wherein the circuit board assembly is provided in a space formed between the middle frame and a rear cover.

18. The electronic device according to claim 14, wherein the accommodating groove comprises a bottom surface and side surfaces, the bottom surface intersects the side surfaces, a shape of a surface of the second soldering portion that faces the bottom surface matches a shape of the bottom surface, and a shape of a surface of the second soldering portion that faces the side surface matches a shape of the side surface.

19. The electronic device according to claim 14, wherein the accommodating groove runs through two surfaces of the frame body that are opposite to each other along the thickness direction.

20. The electronic device according to claim 14, wherein the first soldering portions and the second soldering portions are respectively soldered to the corresponding pads on the circuit board by using solder joints.

* * * * *